United States Patent
Hsu et al.

(10) Patent No.: US 6,794,936 B2
(45) Date of Patent: Sep. 21, 2004

(54) EQUALIZER SYSTEM AND METHOD FOR PREDISTORTION

(75) Inventors: Liang Hsu, Highland Park, NJ (US); Jaehyeong Kim, Pine Brook, NJ (US); Kyriaki Konstantinou, Madison, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 437 days.

(21) Appl. No.: 09/898,154

(22) Filed: Jul. 3, 2001

(65) Prior Publication Data

US 2003/0042978 A1 Mar. 6, 2003

(51) Int. Cl.[7] .............................................. H03F 1/26
(52) U.S. Cl. .......................... 330/149; 330/2; 330/304
(58) Field of Search ......................... 330/2, 149, 304; 375/285, 297

(56) References Cited

U.S. PATENT DOCUMENTS 6,239,657 B1 * 5/2001 Bauer

FOREIGN PATENT DOCUMENTS

WO   WO-200148998   *  7/2001

\* cited by examiner

*Primary Examiner*—Henry Choe
(74) *Attorney, Agent, or Firm*—Julio A. Garceran

(57) ABSTRACT

A predistortion system compensates or equalizes the phase and/or amplitude response over frequency of at least a portion of a signal path prior to the distortion generating circuitry, such as an amplifier, and/or of at least a portion of a feedback path after the distortion generating circuitry. For example, in a power amplification system using predistortion, an equalizer on the signal path adjusts the phase and amplitude of a predistorted signal across frequency to compensate for the amplitude and phase response of circuitry on the signal path, such as the amplitude and phase response of analog filters in the up-conversion process. After amplification, an equalizer on a feedback path adjusts the phase and amplitude across frequency of the signal representing the output of the amplifier to compensate for the amplitude and phase response of circuitry, such as analog filters in the down-conversion process, on the feedback path. Thus, the distortions introduced onto the envelope of the predistorted signal on the signal path and onto the amplifier output signal on the feedback path can be reduced. As such, the distortion of an input used in the predistortion function determination is reduced, thereby enabling an improved characterization of the amplifier and/or an improved determination of the predistortion function.

17 Claims, 2 Drawing Sheets

EQUALIZER SYSTEM AND METHOD FOR PREDISTORTION

BACKGROUND OF THE INVENTION

1. Field of the Invention

This invention relates to communications, and, more particularly, to a system and method for a distortion reduction system using predistortion.

2. Description of Related Art

An ideal power amplifier amplifies an input signal with no waveshape alteration. The ideal power amplifier is therefore characterized as having a transfer function (input signal vs. output signal) which is linear with no transfer function discontinuities. In practice, however, a power amplifier has a transfer function with nonlinear and "linear" regions. Whether the power amplifier is operating in a linear or nonlinear region depends in part on the amplitude of the input signal. For the power amplifier to achieve as near to linear operation as possible, the power amplifier is designed to operate within its linear region given the range of possible input signal amplitudes. If the input signal has an amplitude which causes the power amplifier to operate outside the linear region, the power amplifier introduces nonlinear components or distortion to the signal. When the input signal possesses peak amplitudes which cause the amplifier to compress, to saturate (no appreciable increase in output amplitude with an increase in input amplitude) or to shut-off (no appreciable decrease in output amplitude with a decrease in input amplitude), the amplifier is being overdriven, and the output signal is clipped or distorted in a nonlinear fashion. Generally, an amplifier is characterized as having a clipping threshold, and input signals having amplitudes beyond the clipping threshold are clipped at the amplifier output. In addition to distorting the signal, the clipping or nonlinear distortion of the input signal, generates spectral regrowth or adjacent channel power (ACP) that can interfere with an adjacent frequency.

In wireless communications systems, high power amplification of signals for transmission are commonly encountered with very large peak to average power ratios (PAR). For example, in a time division multiple access (TDMA) system, such as Global System for Mobile Communications (GSM) or North American TDMA, when multiple carrier signals are combined for amplification with a power amplifier, the resulting PAR is about 9–10 dB for a large number of carriers. In a code division multiple access (CDMA) system, a single loaded 1.25 Mhz wide carrier can typically have a PAR of 11.3 dB. For orthogonal frequency division multiplexing (OFDM), multicarrier signals can have a PAR of up to 20 dB. These signals have to be amplified fairly linearly to avoid generating ACP.

Unfortunately, efficiency of the base station amplifier is inversely related to its linearity. To achieve a high degree of linearity, the amplifiers are biased to operate in the class A or "slight" class AB (meaning class AB operation that is closer to class A than to class B). Maximum AC to DC efficiency achievable for class A operation is 50%, whereas that of a class AB amplifier is between 50 and 78.5% (the latter representing the maximum efficiency of a class B amplifier). The closer the particular class AB operation is to class A, the lower the maximum efficiency. For amplifiers employing field effect transistors, the class of operation is set in accordance with the gate voltage applied, which controls the quiescent (idle) drain current. For class A operation, the gate voltage is set so that the idle drain current is approximately in the middle of the range between cutoff and saturation. Class B amplifiers are biased near cutoff, resulting in a rectified drain current waveform. Class AB amplifiers are biased in between the bias points of classes A and B.

Typically, strict linearity requirements in modern wireless communication systems dictate the use of the relatively inefficient class A or slight class AB modes. As a result, significant DC power is dissipated by the amplifiers, thereby generating heat which must be controlled to avoid degrading amplifier performance and reliability. Hence, the use of elaborate heat sinks and fans become a necessary by-product of the high linearity system. Naturally, these measures add to the cost, size and weight of the base station equipment. As the number of wireless communications users continues to grow, so do the number of base stations and the need to keep them small, light and inexpensive. Thus, a great deal of research has focused on the quest to improve amplifier efficiency in these and other systems.

Various linearization methods are used to enable the use of more cost-effective and more power efficient amplifiers while maintaining an acceptable level of linearity. Feedforward correction is routinely deployed in modern amplifiers to improve the linearity of the main amplifier with various input patterns. The essence of the feed-forward correction is to isolate the distortion generated by the main amplifier on a feed forward path. The distortion is provided to a correction amplifier on the feed forward path which amplifies the distortion. The distortion on the feed forward path is combined with the distortion on the main signal path to cancel the distortion on the main signal path.

Predistortion techniques distort the input signal prior to amplification by taking into account the transfer function characteristics for the amplifier. As such, the desired amplified signal is achieved from the predistorted input signal by intentionally distorting the signal before the amplifier, so the non-linearity of the amplifier can be compensated.

FIG. 1 shows a block diagram of an adaptive power amplifier predistortion system 10. The baseband digital input signal $u_n$ on a main signal path 12 is input into the predistortion function 14 (A(.)) to produce a predistorted signal $x_n$ where n is the time index. After digital to analog conversion by digital to analog (D/A) converter 16, the resulting baseband analog signal is frequency up-converted in an up-conversion process 18 to radio frequency (RF). The analog RF signals are amplified by power amplifier 20 for transmission over the air using antenna 22. A replica of the amplified analog RF signals is coupled off the main signal path 12 onto a predistortion feedback path 24. The amplified analog RF signals on the predistortion feedback path 24 are down-converted by a down-conversion process 26.

The down-converted analog signals on the predistortion feedback path 24 are provided to an analog to digital (A/D) converter 28 for conversion into the digital domain. The resulting digital feedback signal, which represents the output of the amplifier 20, is provided to an amplifier characteristics estimation block 30 along with the digital baseband signal $x_n$ which represents the corresponding input to the amplifier 20. In this embodiment, a delay adjuster 32 equalizes the delays between the digital baseband signal $x_n$ and the baseband digital feedback signal $y_n$ such that the digital signal $x_n$ is received by the amplifier characteristics estimation block 32 at the same time as the corresponding baseband digital feedback signal $y_n$ resulting from the output of the amplifier 20. Given the digital signal $x_n$ prior to amplification and the digital signal $y_n$ resulting from the amplification of the analog and frequency converted versions of the digital signal $x_n$, the amplifier characteristics estimation block 30 can determine the characteristics or a model function of the amplifier 20. Once the model of the amplifier 20 is estimated, a predistortion calculation process 34 determines the predistortion function as the inverse of the amplifier characteristics function, and the predistortion function 14 (A(.)) applied to the input signal un is updated based on the predistortion calculation process 34. For example, the predistortion function is determined by updating coefficients of the predistortion function or model based on the results of the amplifier characteristics estimation.

The up-conversion and down-conversion processes 18 and 26 require mixers and filters in the intermediate frequency (IF) range. Accessible inputs in the baseband digital domain are $x_n$ and $y_n$, but the predistorted signal $x_n$ on the signal path 12 and the resulting signal $y_n$ are distorted by the up-conversion and down-conversion processes 18 and 26. Mixers are non-linear devices which add non-linear distortion. Furthermore, the phase responses of analog filters are not linear which cause different time delays and gains for different frequency components. If the non-linear distortion due to the mixers is negligible, then the amplitude variations and non-linear phase response over frequency of the analog filters is the main source of distortion in the IF signal paths. The different time delays and gains for the different frequencies result in a nonlinear phase response and non-flat or non-constant amplitude response which causes amplitude and/or phase distortion of the input signal envelope, thereby degrading the determination of the predistortion function 14 and thereby of signal amplification.

SUMMARY OF THE INVENTION

The present invention is a predistortion system which compensates or equalizes the phase and/or amplitude response over frequency of at least a portion of a signal path prior to the distortion generating circuitry, such as an amplifier, and/or of at least a portion of a feedback path after the distortion generating circuitry. For example, in a power amplification system using predistortion, an equalizer on the signal path adjusts the phase and amplitude of a predistorted signal across frequency to compensate for the amplitude and phase response of circuitry on the signal path, such as the amplitude and phase response of analog filters in the up-conversion process. After amplification, an equalizer on a feedback path adjusts the phase and amplitude across frequency of the signal representing the output of the amplifier to compensate for the amplitude and phase response of circuitry, such as analog filters in the down-conversion process, on the feedback path. Thus, the distortions introduced onto the envelope of the predistorted signal on the signal path and onto the amplifier output signal on the feedback path can be reduced. As such, the distortion of an input used in the predistortion function determination is reduced, thereby enabling an improved characterization of the amplifier and/or an improved determination of the predistortion function.

BRIEF DESCRIPTION OF THE DRAWINGS

Other aspects and advantages of the present invention may become apparent upon reading the following detailed description and upon reference to the drawings in which.

DETAILED DESCRIPTION

Figure 1:
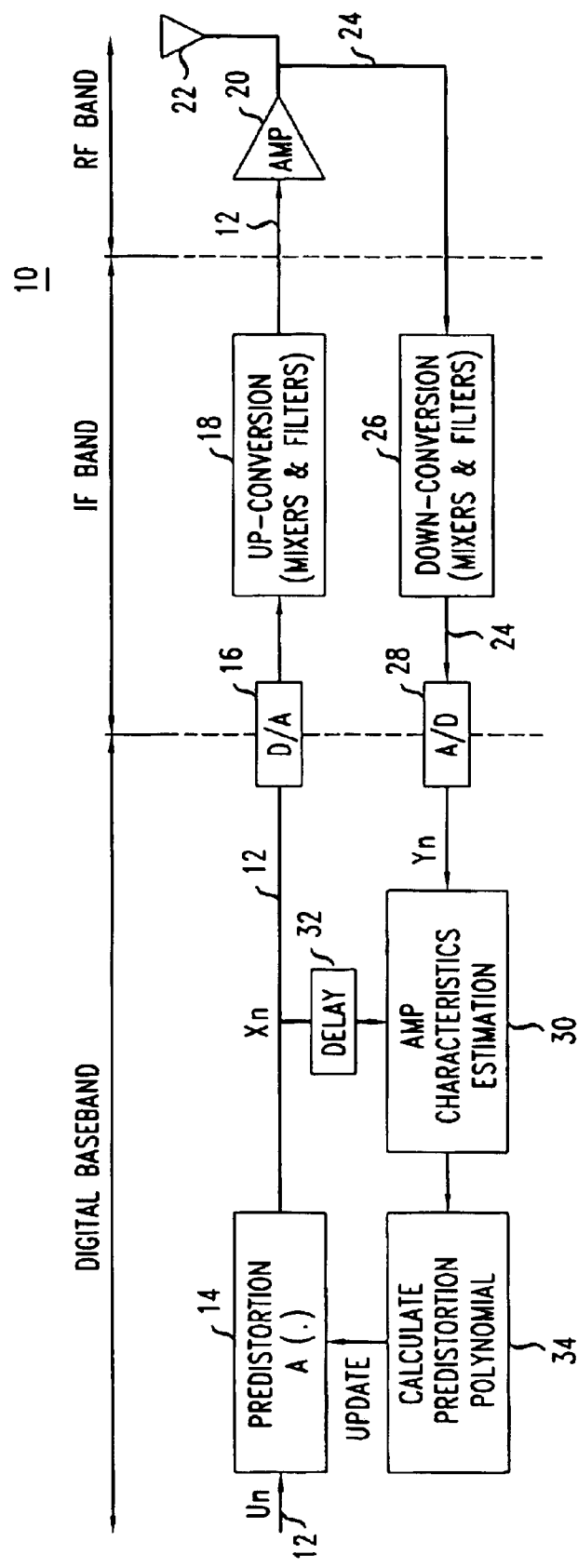
FIG. 1 shows a general block diagram of a typical adaptive power amplifier predistortion system.
Figure 2:
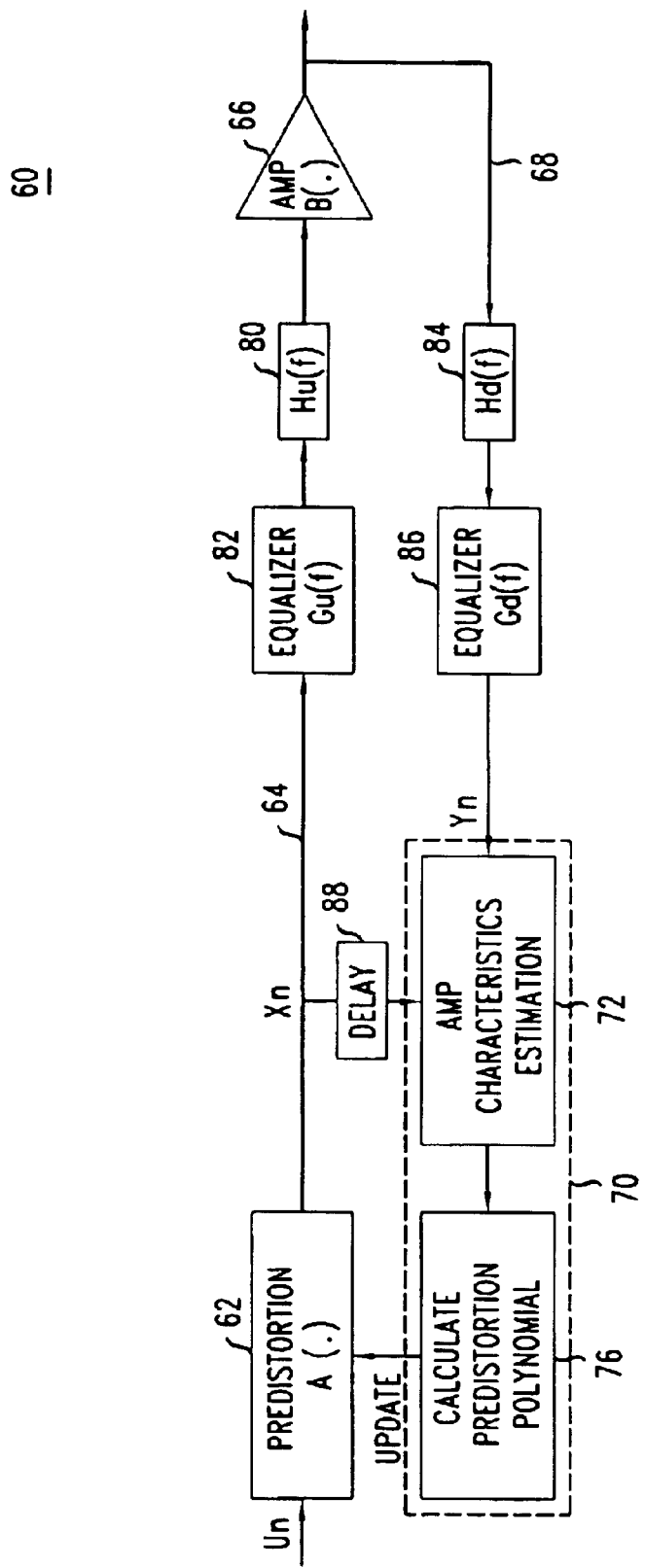
FIG. 2 shows a general block diagram of an adaptive predistortion system according to principles of the present invention.

An illustrative embodiment of an adaptive predistortion amplifier system and method according to principles of the present invention is described below which equalizes or compensates for amplitude variations and/or non-linear phase response experienced by an input used in the predistortion determination such as a signal $y_n$ representing the output of the amplifier which resulted from the corresponding predistorted signal $x_n$. FIG. 2 shows a general block diagram of an adaptive predistortion power amplification system 60. An input signal $u_n$ is provided to a predistortion function 62 (A(.)) to produce the predistorted signal or the output $x_n$ of the predistortion function on a main signal path 64. In this embodiment, the predistorted signal $x_n$ (or a signal representative of the predistorted signal) is provided to a predistortion function determination block 70. The predistorted signal $x_n$ remains on the main signal path 64 where it is frequency up-converted in this embodiment and eventually provided to an amplifier 66 for amplification. After amplification, the amplified predistorted signal $y_n$ (or a signal representative of the amplified predistorted signal) representing the amplified signal is produced on a feedback path 68 where it is frequency down-converted and eventually provided to predistortion function determination block 70 as an input. The predistortion function determination block 70 uses the predistorted signal $x_n$ and the signal $y_n$ on the feedback path 68 to determine the predistortion function, for example by updating coefficients for the predistortion function A(.). The predistortion function can be generated using the signal $x_n$ representing the output of the predistortion function and the corresponding signal $y_n$ representing the output of the amplifier 66.

Depending on the embodiment, the predistortion function can be generated by first estimating the characteristics of the amplifier 66 at block 72, for example by finding the coefficients which minimize the error between the expected output of the amplifier 66 and the signal $y_n$ representing the output of the amplifier 66 given the input $x_n$. After the amplifier characteristics are determined, the predistortion function can be determined and/or updated by finding the inverse to the amplifier characteristics function at a predistortion polynomial calculation block 76. Alternatively, the predistortion function can be directly determined by the predistortion determination block 70 using the signal $x_n$ and the corresponding amplifier output signal $y_n$, for example by minimizing the error between the actual predistortion signal $x_n$ and an expected output of the predistortion function 62. The expected output of the predistortion function 62 can be determined using the amplifier output signal $y_n$ of the amplifier 66 since input signal $u_n$ and amplifier output signal $y_n$ should have the same waveshape since the predistortion function and the amplifier characteristics function B(.) are inverse of each other.

In accordance with principles of the present invention, to improve the predistortion function determination, the phase and/or amplitude across frequency of at least one input to the predistortion determination block 70 is adjusted to reduce the distortion created by the non-linear phase response and/or non-constant amplitude response over frequency experienced by an input to the predistortion function determination in the circuitry on the signal path(s). For example, the signal $y_n$ results from the predistorted signal $x_n$ which is distorted by circuitry on the main signal path 64 and eventually by circuitry on the feedback path 68. By equalizing the response of at least portions of the of the main signal path 64 prior to the amplifier 66 and/or the feedback path 68 after the amplifier 66, the distortion of at least the input $y_n$ to the predistortion function is reduced, thereby enabling improved predistortion function determination.

In FIG. 2, the predistorted signal $x_n$ is provided to the predistortion function determination block 70 as an input. The predistorted signal $x_n$ also remains on the main signal path 64 for amplification by amplifier 66 which has a function B(.) with complex inputs and complex outputs. Before amplification, the predistorted signal $x_n$ is frequency up-converted in this embodiment. Neglecting mixers, the predistorted signal experiences a combined up-conversion filter(s) frequency response 80 ($H_u(f)$) on the signal path 64. $H_u(f)$ can be obtained by measuring the IF signal paths. Equalizer 82 ($G_u(f)$) can be obtained as:

$$G_u(f) = \frac{H_u(f)^* \cdot e^{-j\theta f}}{|H_u(f)|^2},$$

where $H_u(f)^*$ is the complex conjugate of $H_u(f)$ and $\theta$ is the time delay to make the filter causal. The equalizer 82 adjusts the amplitude and/or phase over frequency of the predistorted signal to reduce the amplitude and/or phase distortion introduced by the response 80 on the IF signal path over frequency. For example, across the frequency band of operation different frequencies can experience different amplitude responses and/or group delays leading to amplitude and/or phase response differences over the frequency band of the input signal which produces a distortion of the signal envelope. The equalized predistorted signal $x_n$ is then provided to amplifier 66 for amplification.

After amplification, the amplified predistorted signal (or a representative signal thereof) is provided to the feedback path 68 where the amplified predistorted signal is frequency down-converted in this embodiment. Neglecting mixers, the amplified signal experiences a combined down-conversion filter(s) frequency response 84 ($H_d(f)$) on the feedback path 68. $H_d(f)$ can be obtained by measuring the IF feedback paths. Equalizer 86 ($G_d(f)$) can be obtained as:

$$G_d(f) = \frac{H_d(f)^* \cdot e^{-j\theta f}}{|H_d(f)|^2},$$

where $H_d(f)^*$ is the complex conjugate of $H_d(f)$ and $\theta$ is the time delay to make the filter causal. The predistorted signal has a wider signal bandwidth than the original input signal. Due to the limited speed of digital to analog conversion(D/A) and implementation limits in the IF paths, not all can be passed to the amplifier 66. However, $H_u(f)$ and $H_d(f)$ can have at least three times the signal bandwidth to have reasonably good performance. The equalizer 86 adjusts the amplitude and/or phase over frequency of the amplifier output signal to reduce the distortion introduced by the response 84 on the IF feedback path. The equalized amplifier output signal is provided to the predistortion determination block 70 as an input in determining the predistortion function. In this embodiment, a delay adjuster 88 is shown as equalizing the delays between the digital baseband predistorted signal $x_n$ and the baseband digital feedback signal $y_n$ representing the amplifier output. As such, the predistorted signal $x_n$ is mapped, associated or received at the same time with the corresponding feedback signal $y_n$ by the predistortion function determination block 70.

Thus, the equalizer system and method equalizes the phase and/or amplitude response of the input and/or output of the amplifier 66 such that the determination of the predistortion function can be improved using the equalized signal representing the amplifier output and the corresponding predistorted signal. By adjusting the amplitude and/or phase of the signal over frequency of the input and/or output of the amplifier, the amplitude and/or phase distortion experienced by the predistorted signal $x_n$ on the signal path prior to amplification and/or the amplitude and/or phase distortion experienced by the amplified signal on the feedback path after amplification can be reduced. By reducing the distortion, the determination of the predistortion function can be improved because an improved representation of the amplified output signal is obtained in the feedback signal $y_n$ of the amplified output signal in relation to the corresponding predistorted signal $x_n$.

In addition to the embodiment described above, alternative configurations of the equalizer system for a predistortion system according to the principles of the present invention are possible which omit and/or add components and/or use variations or portions of the described system. Depending on the embodiment, the equalizers 82 and/or 86 can be phase or amplitude equalizers for the respective path 64 and 68. For example, given a combined up-conversion filter(s) frequency response 80 ($H_u(f)$) on the signal path 64, phase equalizer 82 ($G_u(f)$) can be obtained as:

$$G_u(f) = \frac{H_u(f)^* \cdot e^{j\theta f}}{|H_u(f)|},$$

where $H_u(f)^*$ is the complex conjugate of $H_u(f)$ and $\theta$ is the time delay to make the filter causal. The phase equalizer 82 adjusts the phase over frequency of the predistorted signal to reduce the phase distortion introduced by the response 80 on the IEF signal path over frequency. Given a combined down-conversion filter(s) frequency response 84 ($H_d(f)$) on the feedback path 68, phase equalizer 86 ($G_d(f)$) can be obtained as:

$$G_d(f) = \frac{H_d(f)^* \cdot e^{j\theta f}}{|H_d(f)|},$$

where $H_d(f)^*$ is the complex conjugate of $H_d(f)$ and $\theta$ is the time delay to make the filter causal. The phase equalizer 86 adjusts the phase over frequency of the amplifier output signal to reduce the phase distortion introduced by the response 84 on the IF feedback path 68.

Alternatively, given the combined up-conversion filter(s) frequency response 80 ($H_u(f)$) on the signal path 64, amplitude equalizer 82 ($G_u(f)$) can be obtained as:

$$G_u(f) = \frac{1}{|H_u(f)|}.$$

The amplitude equalizer 82 adjusts the amplitude over frequency of the predistorted signal to reduce the amplitude distortion introduced by the response 80 on the IF signal path over frequency. Given a combined down-conversion filter(s) frequency response 84 ($H_d(f)$) on the feedback path 68, amplitude equalizer 86 ($G_d(f)$) can be obtained as:

$$G_d(f) = \frac{1}{|H_d(f)|}.$$

The equalizer 86 adjusts the amplitude over frequency of the amplifier output signal to reduce the amplitude distortion introduced by the response 84 on the IF feedback path.

Additionally, phase and/or amplitude equalizer(s) can be located in different locations on the signal and feedback paths. Coupler(s) could provide a sample(s) of the predistorted and/or amplified signal to processing circuitry to determine the predistortion function. The embodiment of the predistortion function has been described as being used with a particular architecture where the predistorted signal and/or the amplified output signal is adjusted over frequency to compensate for the amplitude and/or phase distortions on the signal and/or feedback paths or at least portions of the paths carrying the signals to the predistortion determination are equalized to compensate for the signal response. The equalizer could compensate for multiple intermediate frequencies stages as well as compensating for the amplitude and/or phase distortions introduced at baseband and/or RF, in the digital and/or analog domain or in other amplifier or electrical circuit arrangements. Moreover, the equalization can be performed at baseband, IF or RF in the digital and/or analog domains.

The predistortion determination and equalization system and method has been described as a predistortion amplifier system, but the predistortion system can be used in any predistortion system which is used to reduce the distortion generated by any distortion generating circuitry which acts on a signal. Depending on the application, the predistortion system can be positioned in or in addition to a feed forward, or other linearization or efficiency-improving techniques. The predistortion equalizer system has been further described as a particular configuration, but it should be understood that the equalization system and portions thereof can be implemented in application specific integrated circuits, software-driven processing circuitry, firmware, programmable logic devices, hardware and/or other arrangements of discrete components as would be understood by one of ordinary skill in the art with the benefit of this disclosure. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of producing predistortion, said method comprising:
   distorting an input signal using a predistortion function to produce a predistorted signal on a signal path for a distortion generating circuit;
   equalizing at least a portion of said signal path prior to said distortion generating circuit;
   receiving on a feedback path a signal from saida distortion generating circuit;
   equalizing a frequency response of at least a portion of said feedback path; and
   using said predistorted signal on said signal path and said corresponding signal on said feedback path to determine said predistortion function.

2. The method of claim 1 wherein said second step of equalizing includes:
   adjusting phase across frequency of said signal on said feedback path.

3. The method of claim 1 wherein said second step of equalizing includes:
   adjusting amplitude across frequency of said signal on said feedback path.

4. The method of claim 1 wherein said second step of equalizing includes:
   adjusting amplitude and phase across frequency of said signal on said feedback path.

5. The method of claim 1 wherein said first step of equalizing includes:
   adjusting phase across frequency of said predistorted signal on said signal path.

6. The method of claim 1 wherein said first step of equalizing includes:
   adjusting amplitude across frequency of said predistorted signal on said signal path.

7. The method of claim 1 wherein said first step of equalizing includes:
   adjusting amplitude and phase across frequency of said predistorted signal on said signal path.

8. The method of claim 1 further comprising:
   amplifying said predistorted signal on said signal path by said distortion generating circuitry.

9. A method of producing predistortion, said method comprising:
   receiving a predistorted signal on a signal path for a distortion generating circuit;
   equalizing a frequency response of at least a portion of said signal path prior to said distortion generating circuitry; and
   receiving on a feedback path said predistorted signal from said distortion generating circuit: and
   equalizing a frequency response of at least a portion of said feedback path;
   determining a predistortion function using said predistorted signal on said signal path and said corresponding predistorted signal on said feedback path.

10. The method of claim 9 wherein said first step of equalizing includes:
    adjusting phase across frequency of said signal on said signal path.

11. The method of claim 9 wherein said first step of equalizing includes:
    adjusting amplitude across frequency of said predistorted signal on said signal path.

12. The method of claim 9 wherein said first step of equalizing includes:
    adjusting amplitude and phase across frequency of said predistorted signal on said signal path.

13. The method of claim 9 wherein said second step of equalizing includes:
    adjusting phase across frequency of said predistorted signal on said feedback path.

14. The method of claim 9 wherein said second step of equalizing includes:
    adjusting amplitude across frequency of said predistorted signal on said feedback path.

15. The method of claim 9 wherein said second step of equalizing includes:
    adjusting amplitude and phase across frequency of said predistorted signal on said feedback path.

16. The method of claim 9 further comprising:
    amplifying said predistorted signal on said signal path by said distortion generating circuitry.

17. A predistortion system comprising:
    a signal path adapted to receive an input signal;
    predistortion circuitry on said signal path adapted to distort said input signal using a predistortion function to produce a predistorted signal on said signal path prior to a distortion generating circuit on said signal path;
    an equalizer on said signal path after said predistortion circuitry and prior to said distortion generating circuit and adapted to adjust said predistorted signal to equalize at least a portion of said signal path prior to said distortion generating circuit;

a feedback path adapted to receive a signal from said distortion generating circuit;

an equalizer on said feedback path adapted to adjust said signal on said feedback path and to equalize a frequency response of at least a portion of said feedback path; and predistortion determination circuitry adapted to receive said predistorted signal on said signal path and said corresponding signal on said feedback path to determine said predistortion function.

* * * * *